United States Patent
Thibeault et al.

(10) Patent No.: US 6,410,942 B1
(45) Date of Patent: Jun. 25, 2002

(54) ENHANCED LIGHT EXTRACTION THROUGH THE USE OF MICRO-LED ARRAYS

(75) Inventors: Brian Thibeault, Santa Barbara; Steven DenBaars, Goleta, both of CA (US)

(73) Assignee: Cree Lighting Company, Goleta, CA (US)

( * ) Notice: Subject to any disclaimer, the term of this patent is extended or adjusted under 35 U.S.C. 154(b) by 1 days.

(21) Appl. No.: 09/713,576

(22) Filed: Nov. 14, 2000

Related U.S. Application Data
(60) Provisional application No. 60/168,817, filed on Dec. 3, 1999.

(51) Int. Cl.[7] .............................................. H01L 33/00
(52) U.S. Cl. .............................. 257/88; 257/91; 257/93; 257/98
(58) Field of Search ............................. 257/88, 91, 93, 257/95, 98

(56) References Cited

U.S. PATENT DOCUMENTS

| | | | |
|---|---|---|---|
| 3,954,534 A | | 5/1976 | Scifres et al. .................. 156/7 |
| 5,153,889 A | * | 10/1992 | Sugawara et al. ............. 372/45 |
| 5,614,734 A | * | 3/1997 | Guido ........................... 257/94 |
| 5,631,474 A | | 5/1997 | Saitoh ........................... 257/88 |
| 5,779,924 A | | 7/1998 | Krames et al. ................ 216/24 |
| 5,793,062 A | | 8/1998 | Kish et al. ..................... 257/98 |
| 5,793,405 A | | 8/1998 | Shakuda ....................... 347/238 |
| 5,898,185 A | | 4/1999 | Bojarczuk, Jr. et al. ..... 257/103 |
| 5,977,566 A | * | 11/1999 | Okazaki et al. ............... 257/99 |

FOREIGN PATENT DOCUMENTS

| | | |
|---|---|---|
| EP | 0022486 | 1/1981 |
| EP | 0544512 A1 | 6/1993 |
| JP | 62123785 | 6/1987 |
| JP | 63239988 | 10/1988 |
| WO | WO9728565 | 8/1997 |
| WO | WO9748138 | 12/1997 |

OTHER PUBLICATIONS

Patent Abstracts of Japan, Pub. No. 62123785, Pub. Date: Jun. 5, 1987 Semiconductor Light Emitting Device.

Patent Abstracts of Japan, Pub. No. 63239988, Pub. Date: Oct. 5, 1988 Luminous Display Device.

(List continued on next page.)

Primary Examiner—Sara Crane
(74) Attorney, Agent, or Firm—Koppel, Jacobs, Patrick & Heybl

(57) ABSTRACT

This invention describes new LED structures that provide increased light extraction efficiency. The new LED structures include arrays of electrically interconnected micro-LEDs that have and active layer sandwiched between two oppositely doped layer. The micro-LEDs are formed on a first spreader layer with the bottom layer of the micro-LEDs in contact with the first spreader. A second spreader layer is formed over the micro-LEDs and in contact with their top layer. The first spreader layer is electrically isolated from the second spreader layer. Each of the spreader layers has a contact and when a bias is applied across the contacts, current spreads to the micro-LEDs and they emit light. The efficiency of the new LED is increased by the increased emission surface of the micro-LEDs. Light from each of the micro-LEDs active layer will reach a surface after travelling only a short distance, reducing total internal reflection of the light. Light extraction elements (LEEs) between the micro-LEDs can be included to further enhance light extraction. The new LEDs are fabricated with standard processing techniques making them highly manufacturable at costs similar to standard LEDs.

38 Claims, 9 Drawing Sheets

OTHER PUBLICATIONS

Patent Abstracts of Japan, Pub. No. 11150303, Pub. Date: Jun. 2, 1999, Light Emitting Parts.

Schnitzer et al., "30% External Quantum Efficiency From Surface Textured, Thin Film Light Emitting Diodes", Applied Physics Letters 63, pp. 2174–2176 (1993).

Knock et al., "Strongly Directional Emission From AlGaAs/GaAs Light Dmitting Diodes" Applied Physics Letters 57, pp. 2327–2329 (1990).

Krames et al., "High Power Truncated Inverted Pyramid (AlxGal–x)o.5ln0.5P/GaP Light Emitting Diodes Exhibiting>50% External Quantum Efficiency", Applied Physics Letters 75, p. 2365–2367 (1999).

Schnitzer et al., "Ultrahigh Spontaneous Emission Quantum Efficiency, 99.7% Internally and 72% Externally, from AlGaAs/GaAs/AlGaAs Double Heterostructures" Applied Physics Letters 62, p. 131–133 (1993).

* cited by examiner

ENHANCED LIGHT EXTRACTION THROUGH THE USE OF MICRO-LED ARRAYS

This application claims the benefit of provisional application number 60/168,817 to Thibeault et al., which was filed on Dec. 3, 1999.

BACKGROUND OF THE INVENTION

1. Field of the Invention

This invention relates to light emitting diodes and more particularly to new structures for enhancing their light extraction.

2. Description of the Related Art

Light emitting diodes (LEDs) are an important class of solid state devices that convert electric energy to light and commonly comprise an active layer of semiconductor material sandwiched between two oppositely doped layers. When a bias is applied across the doped layers, holes and electrons are injected into the active layer where they recombine to generate light. The light generated by the active region emits in all directions and light escapes the device through all exposed surfaces. Packaging of the LED is commonly used to direct the escaping light into a desired output emission profile.

As semiconductor materials have improved, the efficiency of semiconductor devices has also improved. New LEDs are being made from materials such as GaN, which provides efficient illumination in the ultra-violet to amber spectrum. Many of the new LEDs are more efficient at converting electrical energy to light compared to conventional lights and they can be more reliable. As LEDs improve, they are expected to replace conventional lights in many applications such as traffic signals, outdoor and indoor displays, automobile headlights and taillights, conventional indoor lighting, etc.

However, the efficiency of conventional LEDs is limited by their inability to emit all of the light that is generated by their active layer. When an LED is energized, light emitting from its active layer (in all directions) reaches the emitting surfaces at many different angles. Typical semiconductor materials have a high index of refraction ($n \approx 2.2–3.8$) compared to ambient air ($n=1.0$) or encapsulating epoxy ($n \approx 1.5$). According to Snell's law, light traveling from a region having a high index of refraction to a region with a low index of refraction that is within a certain critical angle (relative to the surface normal direction) will cross to the lower index region. Light that reaches the surface beyond the critical angle will not cross but will experience total internal reflection (TIR). In the case of an LED, the TIR light can continue to be reflected within the LED until it is absorbed, or it can escape out surfaces other than the emission surface. Because of this phenomenon, much of the light generated by conventional LEDs does not emit, degrading efficiency.

One method of reducing the percentage of TIR light is to create light scattering centers in the form of random texturing on the surface. [Shnitzer, et al., "30% External Quantum Efficiency From Surface Textured, Thin Film Light Emitting Diodes", Applied Physics Letters 63, Page 2174–2176 (1993)]. The random texturing is patterned into the surface by using sub micron diameter polystyrene spheres on the LED surface as a mask during reactive ion etching. The textured surface has features on the order of the wavelength of light that refract and reflect light in a manner not predicted by Snell's Law due to random interference effects. This approach has been shown to improve emission efficiency by 9–30%.

One disadvantage of surface texturing is that it can prevent effective current spreading in LEDs which have poor electrical conductivity for the textured electrode layer, such as the case of p-type GaN. In smaller devices or devices with good electrical conductivity, current from the p and n-type layer contacts spreads throughout the respective layers. With larger devices or devices made from materials having poor electrical conductivity, the current cannot spread from the contacts throughout the layer. As a result, part of the active layer does not experience the current and will not emit light. To create uniform current injection across the diode area, a spreading layer of conductive material is deposited on its surface. However, this spreading layer often needs to be optically transparent so that light can transmit through the layer. When a random surface structure is introduced on the LED surface, an effectively thin and optically transparent current spreader cannot easily be deposited.

Another method of increasing light extraction from an LED is to include a periodic patterning in the emitting surface or internal interfaces which redirects the light from its internally trapped angle to defined modes determined by the shape and period of the surface. See U.S. Pat. No. 5,779,924 to Krames et at. This technique is a special case of a randomly textured surface in which the interference effect is no longer random and the surface couples light into particular modes or directions. One disadvantage of this approach is that the structure can be difficult to manufacture because the shape and pattern of the surface must be uniform and very small, on the order of a single wavelength of the LED's light. The pattern can also present difficulties in depositing an optically transparent current spreading layer as described above.

An increase in light extraction has also been realized by shaping the LED's emitting surface into a hemisphere with an emitting layer at the center. While this structure increases the amount of emitted light, its fabrication is difficult. U.S. Pat. No. 3,954,534 to Scifres and Burnham discloses a method of forming an array of LEDs with a respective hemisphere above each of the LEDs. The hemispheres are formed in a substrate and a diode array grown over them. The diode and lens structure is then etched away from the substrate. One disadvantage of this method is that it is limited to formation of the structures at the substrate interface, and the lift off of the structure from the substrate results in increased manufacturing costs. Also, each hemisphere has an emitting layer directly above it, which requires precise manufacturing.

U.S. Pat. No. 5,793,062 discloses a structure for enhancing light extraction from an LED by including optically non-absorbing layers to redirect light away from absorbing regions such as contacts and also redirect light toward the LED's surface. One disadvantage of this structure is that the non-absorbing layers require the formation of undercut strait angle layers, which can be difficult to manufacture in many material systems.

Another way to enhance light extraction is to couple photons into surface plasmon modes within a thin film metallic layer on the LED's emitting surface, which are emitted back into radiated modes. [Knock et al., 'Strongly Directional Emission from AlGaAs/GaAs Light Emitting Diodes' Applied Physics Letter 57, pgs. 2327–2329 (1990)]. These structures rely on the coupling of photons emitted from the semiconductor into surface plasmons in the metallic layer, which are further coupled into photons that are finally extracted. One disadvantage of this device is that it is difficult to manufacture because the periodic structure is a one-dimensional ruled grating with shallow groove depths (<0.1 μm). Also, the overall external quantum efficiencies are low (1.4–1.5%), likely due to inefficiencies of photon to surface plasmon and surface plasmon-to-ambient photon conversion mechanisms. This structure also presents the same difficulties with a current spreading layer, as described above.

Light extraction can also be improved by angling the LED chip's side surfaces to create an inverted truncated pyramid. The angled surfaces provide TIR light trapped in the substrate material with an emitting surface within the critical angle [Krames et al., 'High Power Truncated Inverted Pyramid $(Al_xGa_{1-x})_{0.5}In_{0.5}P/GaP$ Light Emitting Diodes Exhibiting >50% External Quantum Efficiency' Applied Physics Letters 75 pgs. 2365–2367 (1999)]. Using this approach external quantum efficiency has been shown to increase from 35% to 50% for the InGaAlP material system. This approach works for devices in which a significant amount of light is trapped in the substrate. For the case of GaN on sapphire, much of the light is trapped in the GaN film so that angling the LED chip's side surfaces will not provide the desired enhancement.

Still another approach for enhancing light extraction is photon recycling [Shnitzer, et al., 'Ultrahigh spontaneous emission quantum efficiency, 99.7% internally and 72% externally, from AlGaAs/GaAs/AlGaAs double heterostructures', Applied Physics Letters 62, Page 131–133 (1993)]. This method relies on LEDs having a high efficiency active layer that readily converts electrons and holes to light and vice versa. TIR light reflects off the LED's surface and strikes the active layer, where the light is converted back to an electron-hole pair. Because of the high efficiency of the active layer, the electron-hole pair almost immediately reconverts to light that is again emitted in random direction. A percentage of this recycled light strikes one of the LEDs emitting surfaces within the critical angle and escapes. Light that is reflected back to the active layer goes through the same process again. However, this approach can only be used in LEDs made from materials that have extremely low optical loss and cannot be used in LEDs having an absorbing current spreading layer on the surface.

SUMMARY OF THE INVENTION

The present invention provides a class of new LEDs having interconnected arrays of micro-LEDs to provide improved light extraction. Micro-LEDs have a smaller active area, in the range of 1 to 2500 square microns, but the size is not critical to the invention. An array of micro-LEDs is any distribution of electrically interconnected micro-LEDs. The arrays provide a large surface area for light to escape each of the micro-LEDs, thereby increasing the usable light from the LED. The new LED can have many different geometries and because it is formed by standard semiconductor process techniques, it is highly manufacturable.

The new LED includes a conductive first spreader layer with micro-LEDs disposed on one of its surfaces. Each micro-LED has a p-type layer, an n-type layer and an active layer sandwiched between the p- and n-type layers. Either the p- or n-type layer is a top layer and the other is the bottom layer. Current applied to the first spreader layer spreads into each micro-LED's bottom layer. A second spreader layer is included over the micro-LEDs and current from said second spreader spread into the top layer. When a bias is applied across the first and second spreader layers the micro-LEDs emit light.

One embodiment of the second spreader is a conductive interconnected grid-like structure having conductive paths over the micro-LEDs, in contact with the top layer of the micro-LEDs. An insulator layer is included over the array with the grid on the insulator layer, thereby electrically isolating the first spreader layer from the grid.

Alternatively, flip-chip bonding can be used to interconnect the micro-LEDs. Using this method, an unconnected micro-LED array is first formed and then bonded to an electrically conductive material to provide the array interconnection. In a third embodiment, the grid passes over the micro-LEDs and the p-type, active, and n-type material is under the conductive paths of the grid between the micro-LEDs to electrically isolate the grid from the first spreader layer. This grid-like structure can be designed so that emitted light interacts with a sidewall after traveling a small distance.

The new LED can have LEEs disposed between the micro-LEDs or formed on the side surfaces of the micro-LEDs, to further enhance light extraction. The LEEs act to redirect or focus light that would otherwise be trapped or absorbed through TIR in a standard LED structure. Their shapes may be curved (convex or concave) or piecewise linear with the shape of the structure affecting the light extraction and final output direction of light. LEEs that are placed between the micro-LEDs interact with light escaping from the sides of the micro-LEDs. This interaction helps prevent the light from reflecting back into the LED to be absorbed, thereby increasing the useful light out of the LED.

These and other further features and advantages of the invention will be apparent to those skilled in the art from the following detailed description, taken together with the accompanying drawings, in which:

DETAILED DESCRIPTION OF THE INVENTION

Figure 1:
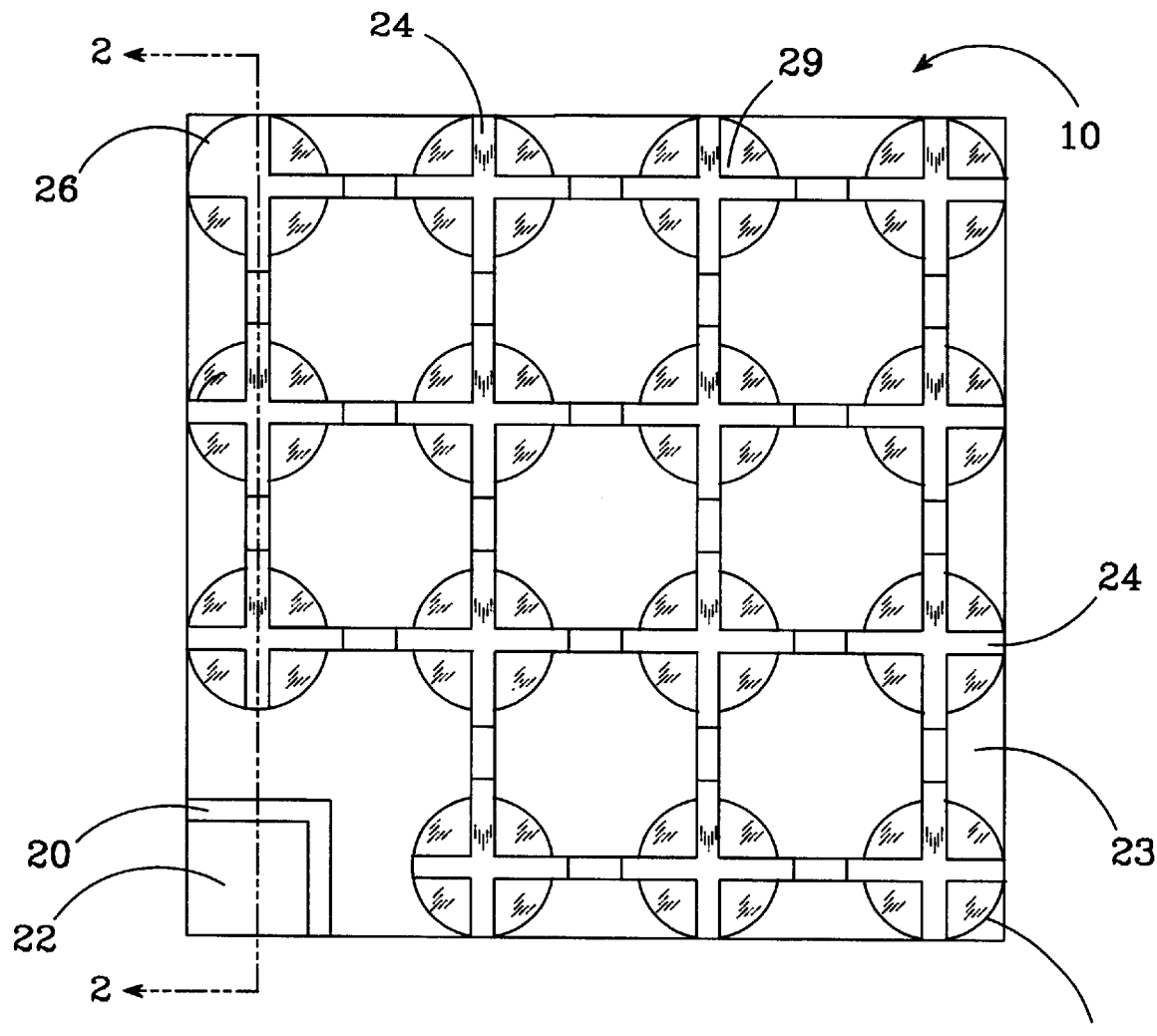
FIG. 1 is a plan view of a the new LED with a micro-LED array having an interconnecting current spreading grid on an electrically insulating layer.
Figure 2:
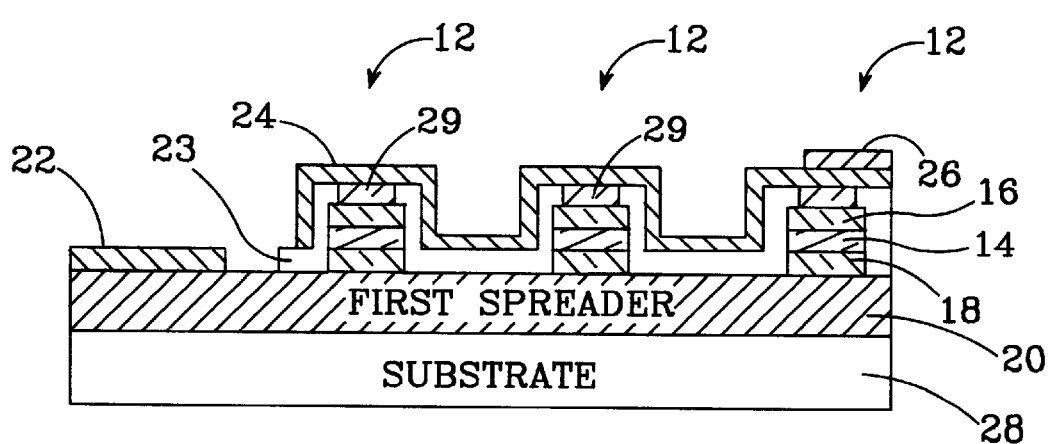
FIG. 2 is a sectional view of the new LED shown in FIG. 1 taken along section lines 2—2.

FIGS. 1 and 2 show one embodiment of the new LED 10 constructed in accordance with the present invention. It includes an array of micro-LEDs 12 with each micro-LED 12 being isolated and having its own active layer of semiconductor material 14 sandwiched between two oppositely doped layers 16 and 18. In the preferred micro-LED, the top layer 16 is p-type and the bottom layer 18 is n-type, although opposite doping in the layers 16, 18 will also work.

The new LED also includes a first spreading layer 20 that spreads current from the n-contact pad 22 to each micro-LED's bottom layer 18. The contact pad 22 is referred to as the n-contact pad because in the preferred embodiment the bottom layer 18 is n-type. An insulating layer 23 is deposited over the micro-LED array, covering each micro-LED and the surface of the first spreader in the gaps between the micro-LEDs. A second spreading layer, preferably in the form of an interconnected current spreading grid 24, is deposited on the insulating layer with the grid's conductive paths passing over the micro-LEDs. A p-contact 26 is deposited on the grid 24 and current from the contact spreads through the grid to top layer 16 each micro-LED 12. The contact 26 is referred to as the p-contact because in the preferred embodiment the top layer 16 is p-type.

A hole is formed through the insulating layer on top of each micro-LED and a micro-LED contact 29 is included in each insulating layer hole to provide contact between the grid 24 and the micro-LED's top layer 16. The micro-LEDs (except for the holes) and the surface of the first spreading layer are electrically isolated from the current spreading grid by the insulating layer 23. The entire structure is formed on a substrate 28 and the micro-LEDs form an array that emits light when a bias is applied across the contacts 22 and 26. In another embodiment, a transparent conductive sheet is used as the second spreader in place of the grid 24.

The new LED 10 has enhanced light emission because of the increased emission surface area provided by the isolated micro-LEDs. Light generated from each micro-LED's active layer interacts with the edge of the micro-LED after only a very short distance. If the light is within the critical angle, it escapes from the micro-LED and contributes to the LED's light emission. The new LED is especially useful for LED structures in which a portion of emitted light cannot be transmitted to the substrate due to total internal reflection (TIR) at the current spreader-substrate interface. This is the situation for GaN-based LEDs on sapphire, AlN, or MgO substrates.

The new LED 10 is manufactured by first depositing the first spreader layer 20 on the substrate 28. An epitaxially grown LED structure with an n-type, p-type and an active layer, is then formed on the first spreader layer 20. The micro-LEDs are formed from the LED structure by etching away portions of the structure using semiconductor etching techniques such as wet chemical etching, RIE, Ion Milling, or any other technique used for removing semiconductor material.

Each remaining micro-LED forms an independent and electrically isolated device having an active layer surrounded by oppositely doped layers 16 and 18. The shape and position of the micro-LEDs 12 can be varied with the preferred shape of each micro-LED being cylindrical. When viewed from above, each micro-LED appears circular with a diameter of between 1 and 50 microns. The micro-LEDs are preferably formed in a close packed pattern to maximize the usable micro-LED space. The separation between adjacent micro-LEDs is preferably in the range of 1 to 50 μm, although the separation is not critical to this invention. The insulator layer 23 is deposited over the entire structure by various methods such as evaporation, CVD or sputtering. Openings are then etched in the insulator layer 23 above each micro-LED 12. The micro-LED contacts and the electrically conductive grid are then deposited by standard deposition techniques.

The first spreader layer 20 may be either a conductive layer deposited on the substrate or the substrate itself, if it is conductive. Preferred conductive substrates for GaN-based LEDs include GaN or Silicon Carbide (SiC). SiC has a much closer crystal lattice match to Group III nitrides such as GaN and results in Group III nitride films of high quality. Silicon carbide also has a very high thermal conductivity so that the total output power of Group III nitride devices on silicon carbide is not limited by the thermal dissipation of the substrate (as is the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

If the substrate is the current spreading layer, the bottom contact can be deposited by metalization on any of the substrate's exposed surfaces. The preferred LED has micro-LEDs 12 that are AlGaInN based with a p-type surface as its top layer 16. The substrate is sapphire, the first spreader is n-type AlGaInN (or an alloy thereof), and the contact metalization is Al/Ni/Au, Al/Ti/Au, or Al/Pt/Au. The insulating layer 23 can be made of many materials such as, but not limited to, SiN, SiO2, or AlN.

The grid 24 can be any electrically conductive material including metals, semi-metals, and semiconductors. It can be made of Al, Ag, Al/Au, Ag/Au, Ti/Pt/Au, Al/Ti/Au, Al/Ni/Au, Al/Pt/Au or combinations thereof. Alternatively, the grid can be made of a thin semi-transparent metal such as Pd, Pt, Pd/Au, Pt/Au, Ni/Au, NiO/Au or any alloy thereof. The grid 24 can be deposited on the new LED by many conventional methods with the preferred methods being evaporation or sputtering. In the preferred embodiment, the paths of the current spreading grid 24 are between 1 and 10 μm wide. The micro-LED contacts 29 can be made of Pt, Pt/Au, Pd, Pd/Au, Ni/Au, NiO, or NiO/Au. The p-contact 26 can be deposited on the interconnected grid 24 in various locations to allow current from the contact to spread throughout the grid.

Figure 3:
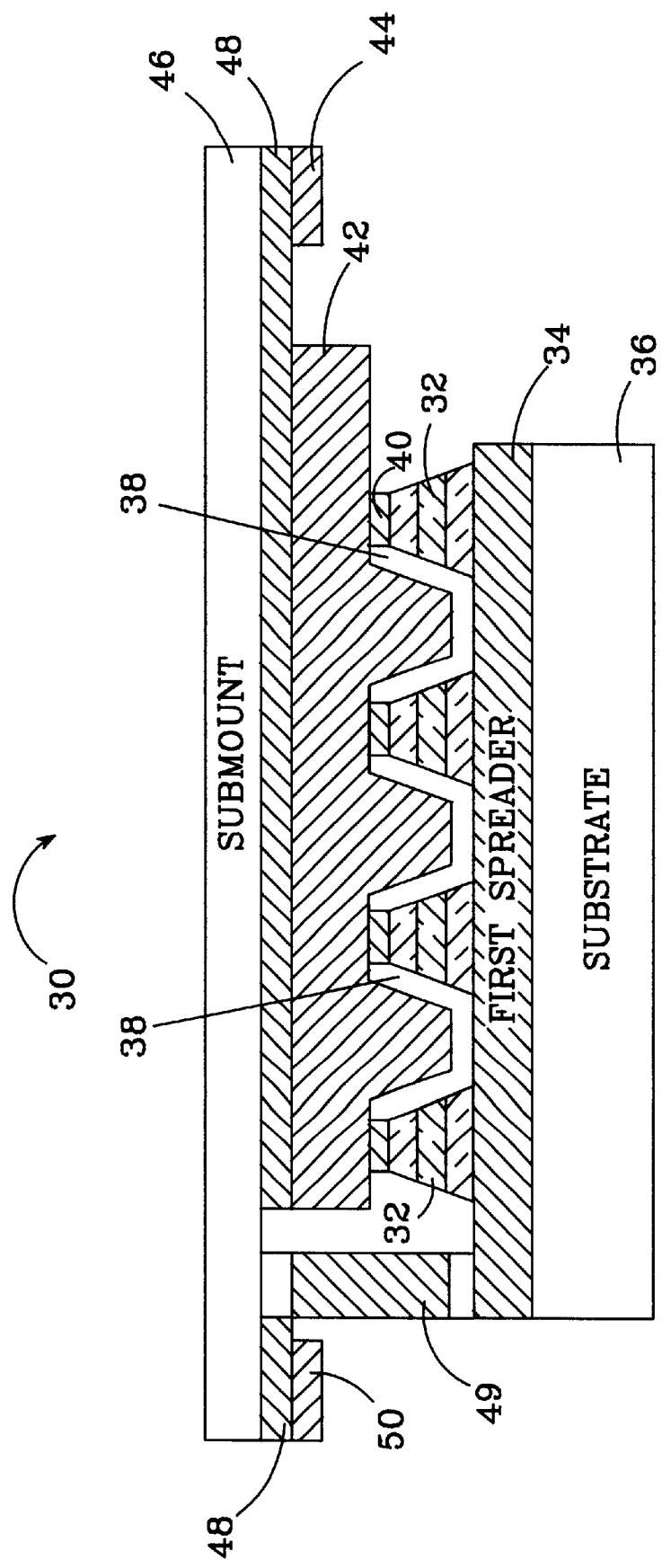
FIG. 3 is a sectional view of another embodiment of the new LED with its micro-LED array bonded to a submount using flip-chip mounting.

FIG. 3 shows a second embodiment of the LED 30 constructed in accordance with the present invention, utilizing flip-chip mounting. As above, micro-LEDs 32 are formed in an array by etching away semiconductor material of a full LED structure. Each micro-LED 32 has an active layer surrounded by two oppositely doped layers. The micro-LED arrangement and size is similar to the embodiment described above. However, in this embodiment each of the micro-LEDs has angled side surfaces and their top layer is narrower than its bottom layer. Like above, the micro-LED array is formed on a first spreader layer 34 that is formed on a substrate 36. An insulating layer 38 covers the micro-LEDs and the surface of the first spreader between adjacent micro-LEDS. On each micro-LED 32, a hole is included in the insulating layer for a top contact 40 A second spreader layer 42 coats the entire micro-LED array to interconnect the top contacts 40.

The surface of the second spreader 42 opposite the micro-LEDs is bonded to a reflective metallic layer 48 on a submount 46 by a bonding media. A p-contact 44 is included on the metallic layer 48 and current applied to the second contact spreads throughout the second spreader, to the top contacts 40 and to the top layer of the micro-LEDs 32. There is a break in the metallic layer 48 and the n-contact 50 is formed on the portion of the metallic layer 48 that is electrically isolated from the portion having the p-contact. The finger 49 is bonded between the submount and the first spreader and conducts current from the contact 50 through the metallic layer 48, through the finger and to the first spreader 34. The current then spreads throughout the first spreader and to the bottom layer of the micro-LEDs.

In this flip-chip embodiment, light from the LED 50 is primarily emitted through the substrate 36. The second spreader 42 can be optically reflective so that light emitted from the micro-LEDs 32 in the direction of the second spreader 42 is reflected towards the LED's substrate 36. Al or Ag is preferably used as the second spreader and each micro-LED 32 is AlGaInN based with a p-type top layer. Each top contact 40 is preferably Pt, Pt/Au, Pd, Pd/Au, Ni/Au, NiO, or NiO/Au.

This embodiment provides increased sidewall interaction with the emitted light as a result of the isolated micro-LEDs. The portion of the second spreader 42 that is disposed between the micro-LEDs functions as LEEs by reflecting light from the micro-LEDs toward the substrate. This configuration also provides improved heat transfer out of the new LED chip through the submount.

Figure 4:
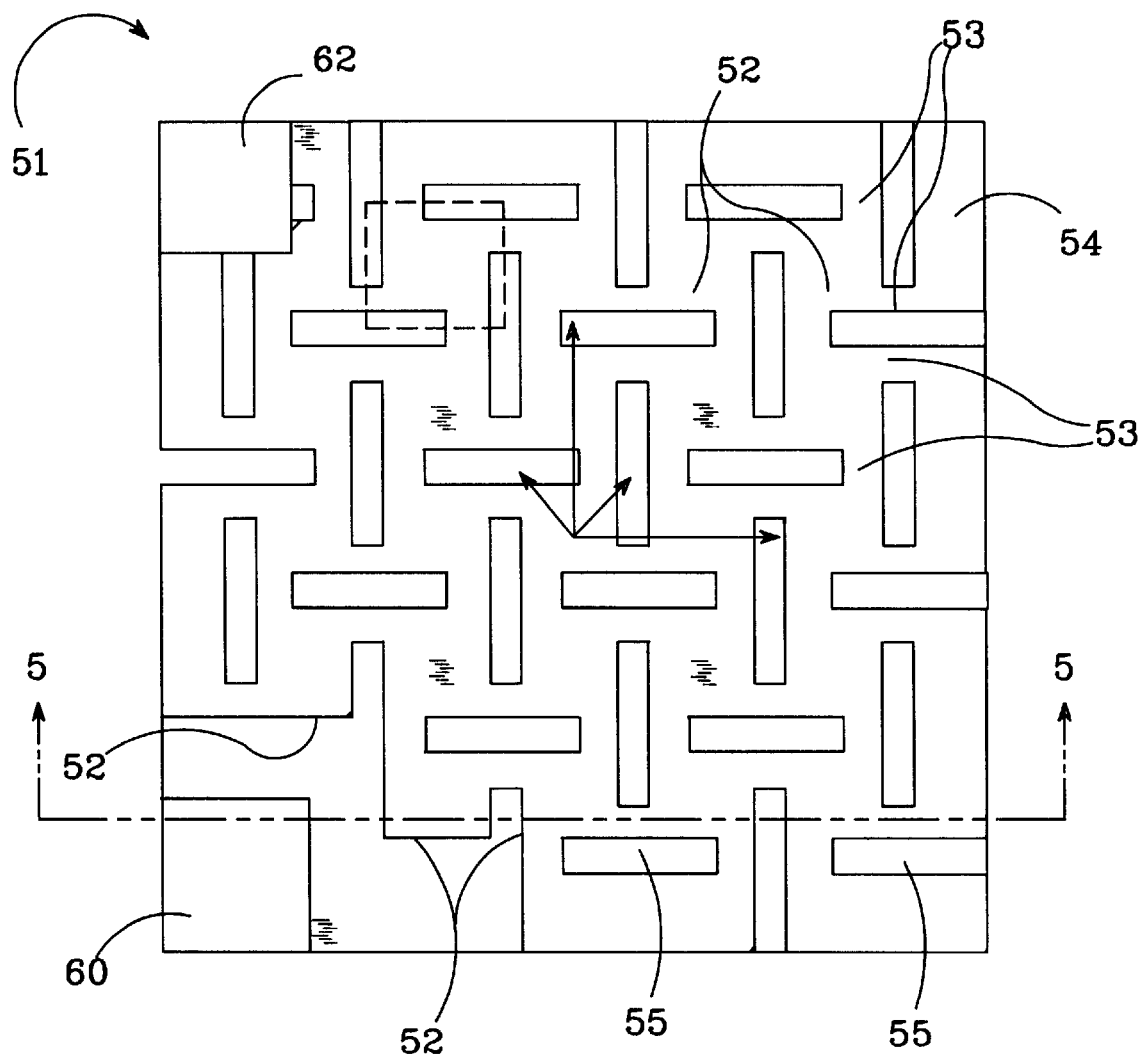
FIG. 4 is a plan view of a third embodiment of the new LED conductive interconnect current spreading grid and semiconductor material below the grid paths.
Figure 5:
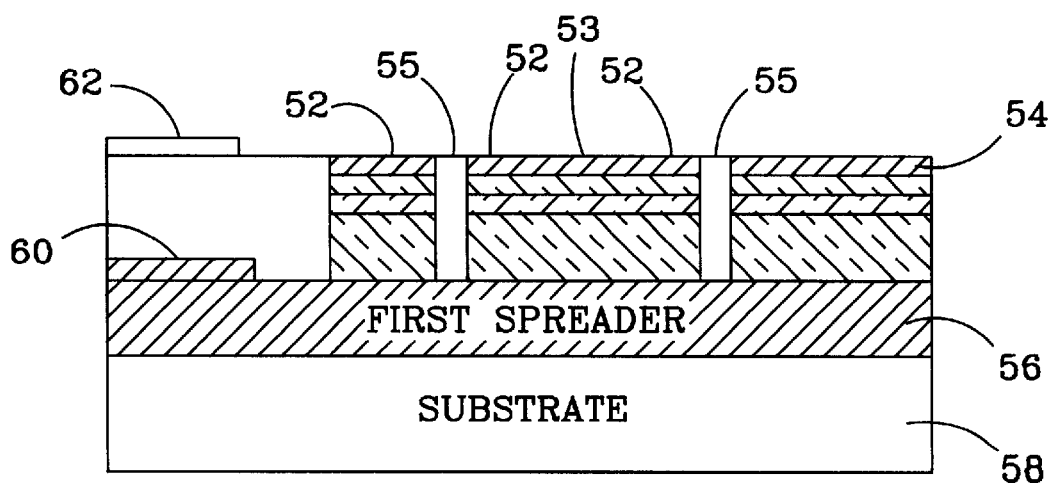
FIG. 5 is a sectional view of the LED shown in FIG.4, taken along section lines 4—4.

FIGS. 4 and 5 show another embodiment of the new LED 51 that does not have an insulator layer to isolate the first spreader from the second. Instead, micro-LEDs 52 are connected to adjacent micro-LEDs by conductive paths 53 of an interconnected grid 54, wherein the paths have semiconductor material below them. Each opening 55 in the grid 54 is an area where semiconductor material was etched from the LED structure when manufacturing the LED 50. Portions of the structure remain under the grid 54 as micro-LEDs 52 and as semiconductor material under the grid paths 53 between the micro-LEDS. The micro-LEDs and the material under the paths comprise an active layer surrounded by two oppositely doped layers, with the entire structure formed on a first spreader layer 56 and a substrate 58.

A first contact 60 is deposited on the first spreader to apply current to the bottom layer of the micro-LEDs and a second contact 62 is included on the current spreading grid to spread current to the top layer of the micro-LEDs. When a bias is applied across the contacts 60 and 62, current is applied to the micro-LEDs and the semiconductor material under the conductive paths, all of which emit light. Light escapes from the side surfaces of the micro-LEDs material under the paths, avoiding total internal reflection. This technique is therefore generally applicable to any LED structure on any substrate and is implemented with standard processing techniques.

The LED 51 is manufactured by first depositing the first spreader layer 56 on the substrate 58, and then forming a continuous LED structure that covers the current spreading layer 56. The grid 54 is deposited on the LED structure and portions of the LED structure that are visible in the grid openings are etched away by various methods such as wet chemical etching, Reactive Ion Etching (RIE), Ion Milling, or any other technique used for removing semiconductor material. Portions of the LED structure are also etched to provide an area for contact pads 60, and contact pads 60 and 62 are deposited. The grid 54 can be made of any electrically conductive material including but not limited to metals, semi-metals, and semiconductors or combinations thereof. The preferred micro-LEDs are GaN-based with each micro-LED's top layer 55 being a p-type AlGaInN or any alloy thereof, and the grid 54 is preferably made of a thin metal such as Ni, Pd, Au, Pt or any combination thereof.

The dashed line in FIG. 4 illustrates one of the micro-LEDs and the area around the micro-LED where LEEs can be included to further enhance light extraction as more fully described below.

Figure 6:
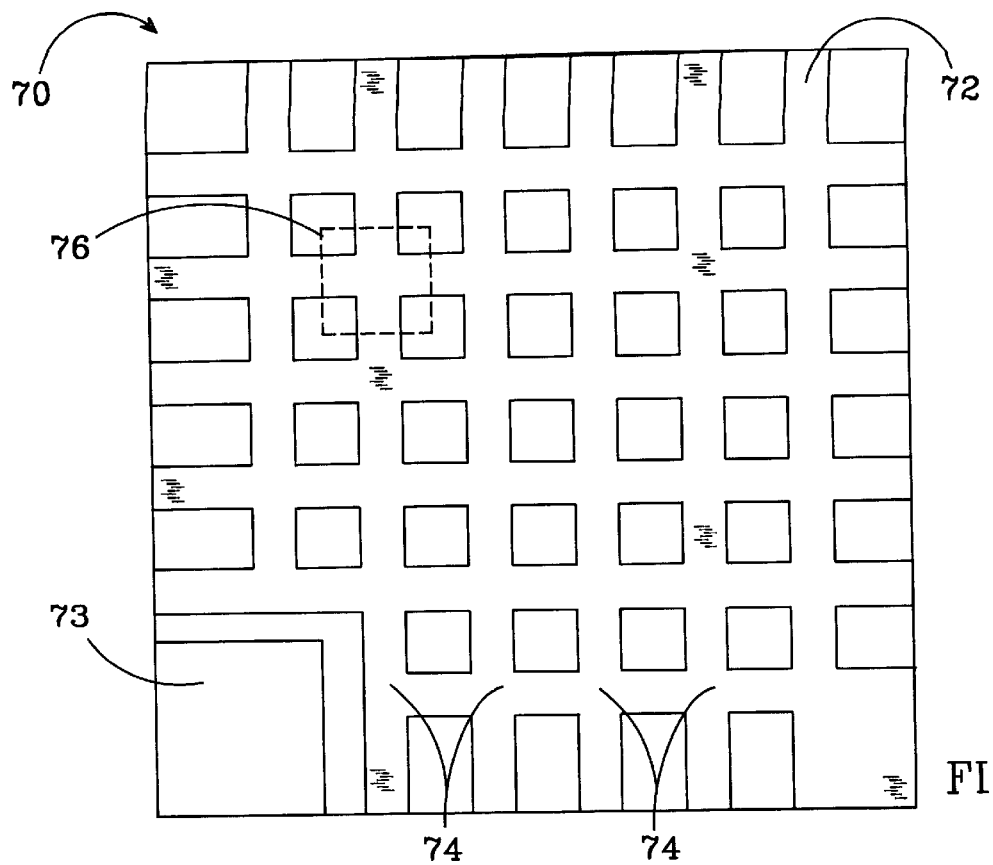
FIG. 6 is a plan view of an alternative interconnecting current spreading grid.
Figure 7:
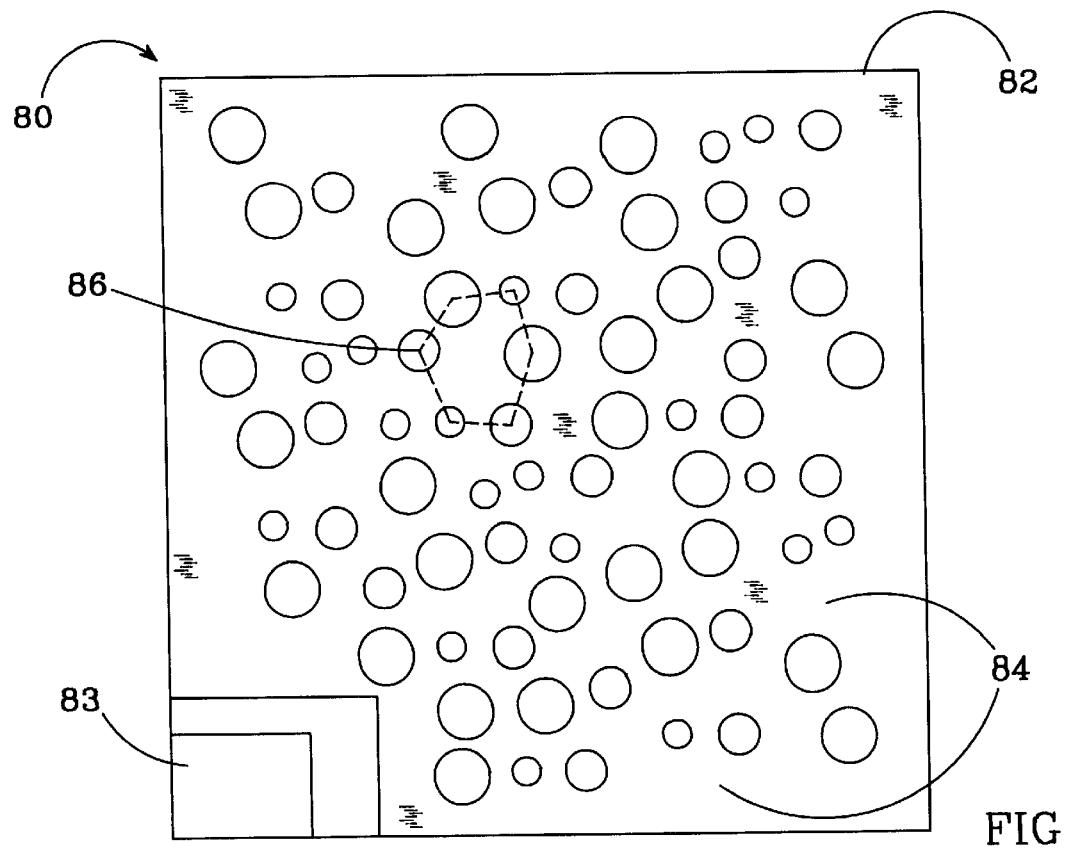
FIG. 7 is a plan view of another alternative of an interconnecting current spreading grid.

FIGS. 6 and 7 show two additional embodiments 70 an 80 of the new LED with different micro-LED and grid patterns 72 and 82, although many different patterns can be used. Each embodiment has a respective bottom spreading contact 73 and 83. In FIG. 6, the micro-LEDs 74 are interconnected crosses with current spreading to each of the micro-LEDs through the various paths. Each path has semiconductor material below it to isolate it from the first spreader layer. The grid 72 provides a square array pattern of openings for light interaction.

The grid 54 has an advantage over grid 72. In LED 70, TIR light can reflect down one of the grids numerous conductive paths and reflect within the LED without interacting with a surface of one of the micro-LEDs. Optical loss present in the grid or underlying layers will cause some of this TIR light to be absorbed before it can escape out the final edge of the new LED. The grid 54 reduces this problem because light emitting from the micro-LEDs will reach a side surface after travelling only a short distance (at most two micro-LED lengths), thereby increasing the light out of the device.

In FIG. 7 the micro-LEDs are randomly shaped and have random interconnecting paths. Again, the paths have semiconductor material below them. The random pattern reduces the number of paths for the TIR to travel before it will encounter one of the micro-LEDs in one of the grid openings. Like above, the dashed lines around the micro-LEDs in FIGS. 6 and 7 illustrate the micro-LED 76 and 86 with LEEs around their perimeters, as more fully described below.

Opening sizes and distances between openings are preferably between 1 and 30 $\mu$m, but may be larger or smaller. The pattern of the openings may be aperiodic or periodic since the nature of the light interaction with the micro-LED edges does not require either condition. In the preferred embodiment on a p-type AlGaInN layer, the grid openings are between 1 micron and 20 $\mu$m and the micro-LEDs have a width between 1 $\mu$m and 30 $\mu$m.

All of the previous three embodiments can be integrated with LEEs between micro-LEDs to further increase light emission. The LEEs can either be formed on the side surfaces of the micro-LEDs or on the surface of the first spreader layer or the conductive substrate in those embodiments having no first spreader layer.

Figure 8:
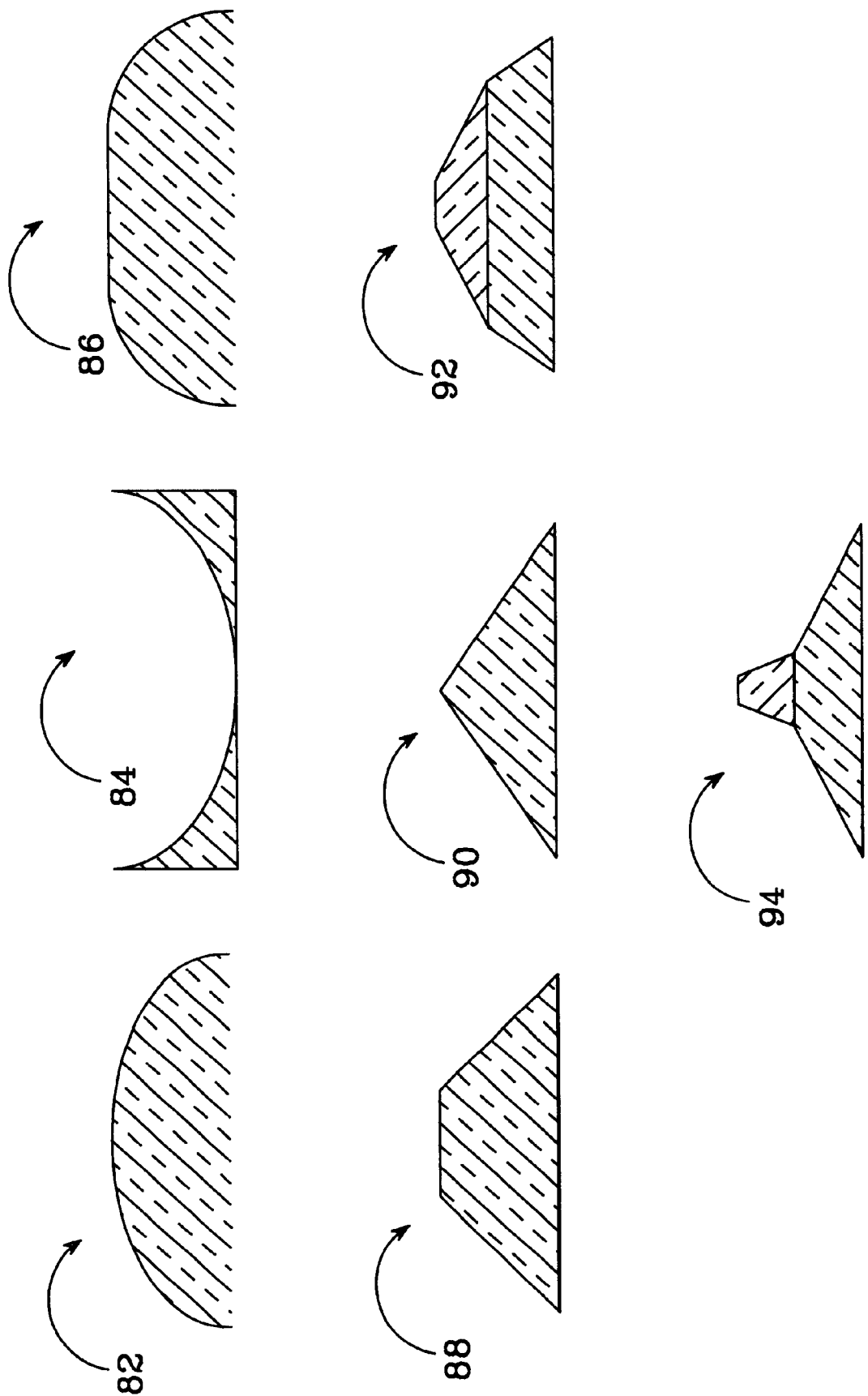
FIG. 8 shows sectional views of the basic shapes of LEEs that can be integrated within the micro-LEDs.

FIG. 8 shows several alternative shapes of LEEs that are included as embodiments in this invention, although other shapes can be used and the scope of this invention is not limited to the shapes shown. LEEs 82, 84, 86 have curved surfaces while the LEEs 88, 90, 92, 94 have piecewise linear surfaces. Alternatively, the LEE may be a randomly roughened layer that acts as a light disperser.

The LEEs can be formed by standard etching techniques such as wet chemical etching, RIE, or ion milling. In the preferred embodiment, the LEEs are formed by using a commercially available polymer (such as a UV or e-beam sensitive photoresist) as an ablative etch mask. This polymer is first deposited and patterned with square-like edges. The polymer is heated to a temperature and reflows like glass to give a gradual linear or curved shape to the edges of the polymer. The polymer thickness, pattern shape, heating temperature and heating time will determine the edge shape. The pattern is transferred to the AlGaInN based micro-LEDs with RIE. Linear and curved LEEs are easily fabricated by this method and piecewise linear LEEs can be easily formed by using multiple ablative masks.

A second technique for forming LEEs is to use a negative polarity UV-exposable photoresist. First, the photoresist is exposed for a particular exposure time and is treated to produce a negative polarity. The photoresist is then developed to produce an undercut curved or linear shape in its profile. This pattern can then be transferred to the semiconductor material through a dry etching technique. For both embodiments, the dry etching conditions will also impact the final shape of the lens in the semiconductor material.

FIGS. 9–15 show embodiments of the new LED with LEEs integrated within the micro-LED array in a variety of ways to enhance light extraction. These embodiments represent a few of the possible ways that the LEEs can be used in accordance with this invention, and the scope of this invention is not limited to the described embodiments.

Figure 9:
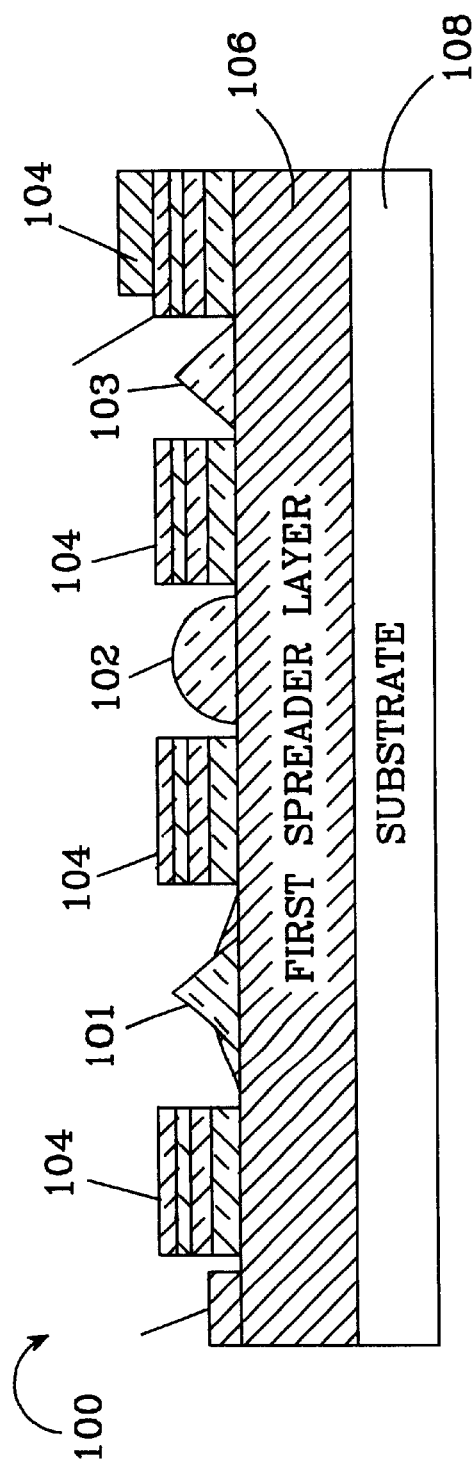
FIG. 9 is a sectional view of the new LED with different LEEs formed between the micro-LEDs.

FIG. 9 shows a new LED 100 that is similar to the LED 50 in FIGS. 4 and 5, but has LEEs 101, 102, 103 between the micro-LEDs 104. The LEEs 101, 102, 103 allow light that is directed through a micro-LED's side surface to reflect off the LEEs and be re-directed away from the substrate into a package. Light rays that reflect off of the interface between the substrate 108 and first spreader layer 106 through TIR can also interact with the LEEs 101, 102, 103 to escape into the package, providing a higher light output. The LEEs depicted in FIG. 8 can be either deposited onto or processed into the new LED. As described above, the depth of the LEEs can also be varied with the preferred depth in the range of 0.5 µm to 10 µm.

Figure 10:
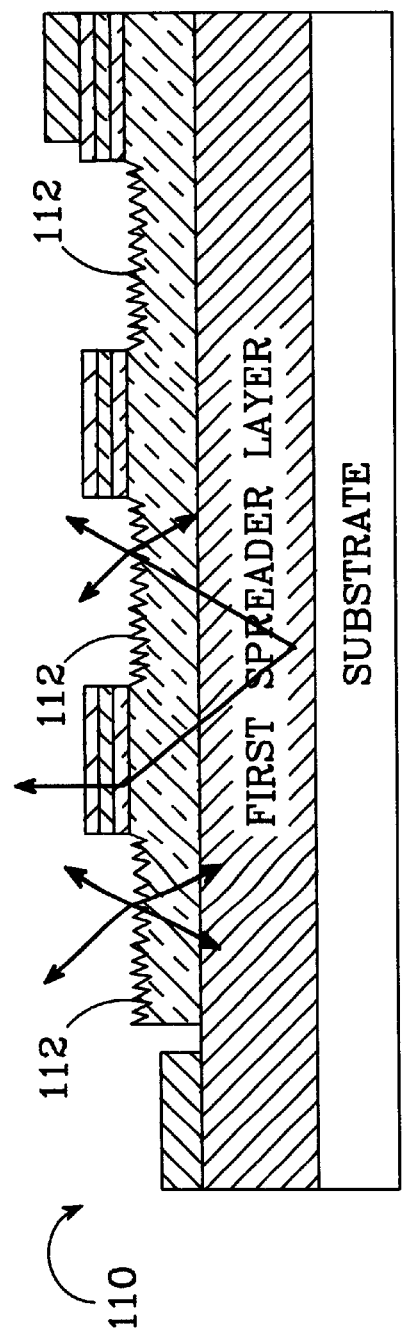
FIG. 10 is a sectional view of the new LED with LEEs in the form of randomly textured surfaces.

FIG. 10 shows a new LED 110 similar to the LED 100 in FIG. 9, but having randomly roughened dispersion LEEs 112 between the micro-LEDs 113. The light interaction with the roughened layer allows TIR light to reach the surface within its critical angle and escape before being absorbed. In the preferred embodiment, the roughened surface is formed by using polystyrene or silica microspheres as an etch mask to transfer micro-scale roughness into the semiconductor. The depth and width of the random roughness may be less than 20 nm to more that 500 nm, with the preferred size being on the order of the wavelength of light generated by the LED.

Figure 11:
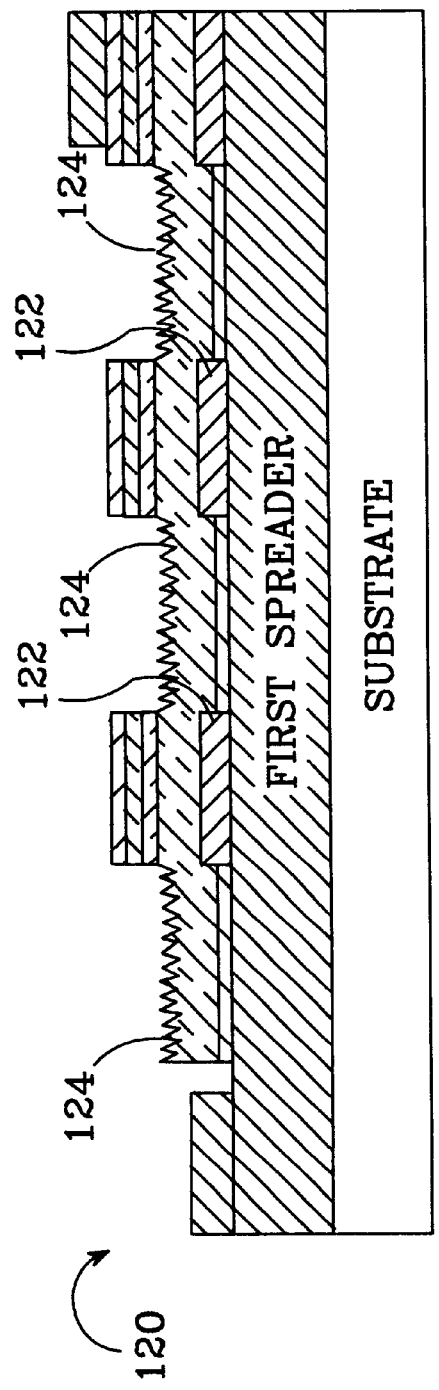
FIG. 11 is a sectional view of the micro-LED array in FIG. 10, having a current blocking layer directly underneath the current spreading grid.

FIG. 11 shows a new LED 120 that is similar to LED 110 in FIG. 10, but includes a current blocking layer within the micro-LED. The blocking layer 122 directs current flow underneath the dispersive LEE 124, increasing the chance for light to interact with the LEE and escape.

Figure 12:
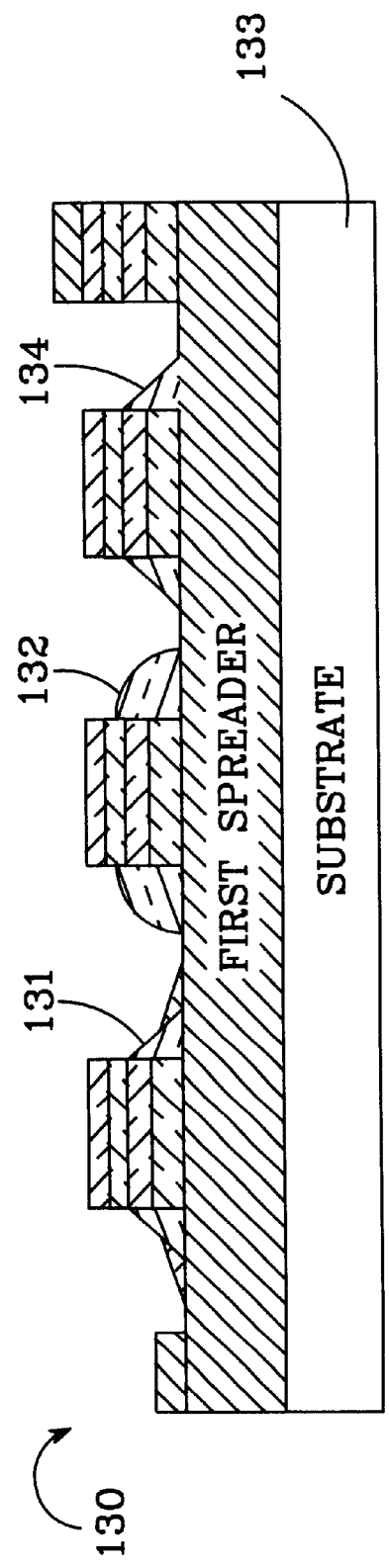
FIG. 12 is a sectional view of the new LED with LEEs integrated on the micro-LED side surfaces.

As an alternative to forming the LEEs between the micro-LEDs, the LEEs can be formed directly on the micro-LED side surfaces. FIG. 12 shows a new LED 130 that is similar to the LEDs in FIGS. 9, 10 and 11, but having various LEEs 131–133 formed directly on each micro-LED's side surfaces. The LEEs can be formed using the same methods as described above. Light that travels towards the micro-LED side surfaces is redirected in directions that cause light to escape out one of the surfaces of the substrate 134, through the first spreader layer 135, or through the micro-LEDs 132. Light that is reflected back from the substrate 134 also has an increased chance of escape due to the LEEs on the micro-LED edges.

Figure 13:
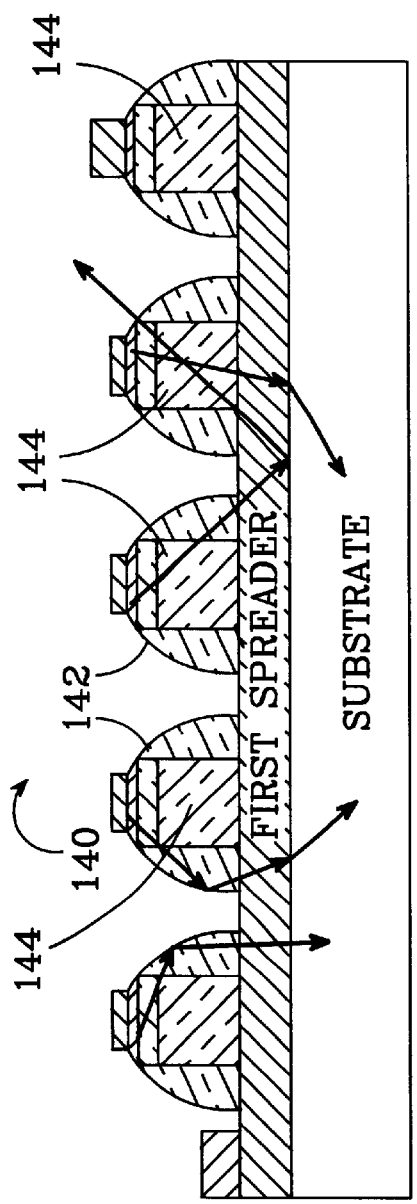
FIG. 13 is a sectional view the new LED with curved surface LEEs integrated on the sides of the micro-LEDs.

FIG. 13 shows a new LED 140 where curved LEEs 142 are formed on the side surfaces micro-LEDs 144. The curved LEEs 142 provide the additional advantage of focusing the LED light into a more well defined direction. The depth and width of the LEEs 142 can be varied with the preferred depth of any one LEE being 0.1 µm to 50 µm.

Figure 14:
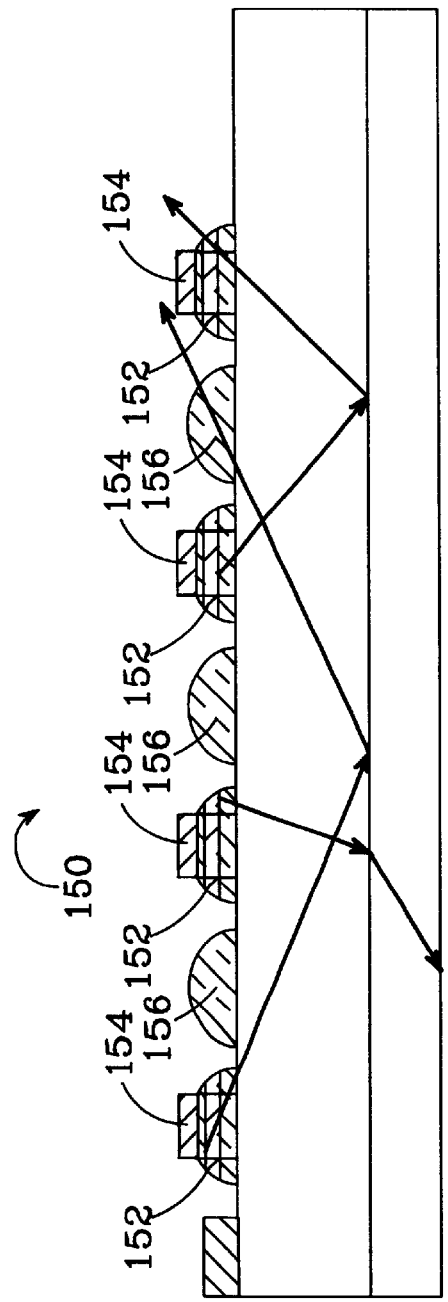
FIG. 14 is sectional view of the new LED with curved surface LEEs integrated on the sides of and between the micro-LEDs.
Figure 15:
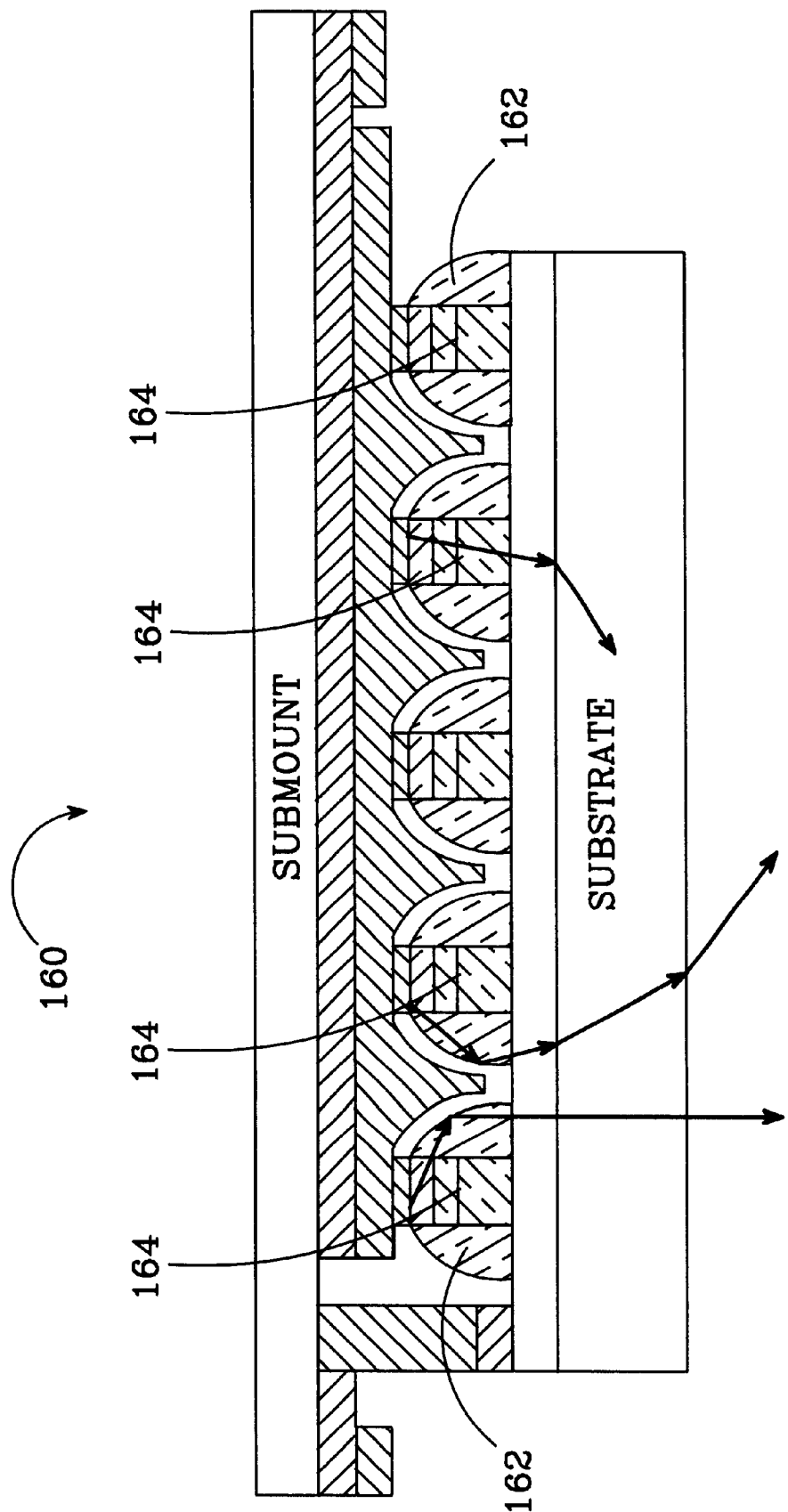
FIG. 15 is a sectional view the new LED of FIG. 4 with curved LEEs.

Two additional embodiments are shown in FIGS. 14 and 15. FIG. 14 shows a new LED 150 with a combination of curved LEEs 152 on the side surface if the micro-LEDs 154 and full curved LEEs 156 between the micro-LEDs 154. The LEEs work together to enhance light extraction by refracting and reflecting light out of the LED package FIG. 15 shows new LED 160 with curved LEEs 162 on the side surfaces of the micro-LEDs 164, using flip-chip embodiment mounting similar to the embodiment shown in FIG. 3. The second spreader 164 is reflective and the substrate 166 is the primary emitting surface. The LEEs 162 and the portions of the second spreader 164 work together to enhance light extraction by refracting and reflecting light out of the LED package through the substrate.

Although the present invention has been described in considerable detail with reference to certain preferred configurations thereof, other versions are possible. For instance, the bottom layers of the micro-LEDs in the array can be in contact. The light extraction structures can also be used in many different combinations and can be many different shapes and sizes. Also, the LED structure described above can have more than one active layer sandwiched between oppositely doped layers. Therefore, the spirit and scope of the appended claims should not be limited to their preferred embodiments described above.

We claim:

1. A light emitting diode (LED) with enhanced light extraction, comprising:
a conductive first spreader layer;
a plurality of micro light emitting diodes (micro-LEDs) separately disposed on a surface of said first spreader layer, each of said micro-LEDs comprising:
a p-type layer;
an n-type layer;
an active layer sandwiched between said p-type and n-type layers wherein either said p-type or n-type layer is a top layer and the other said layer is the bottom layer, current from said first spreader layer spreading into said bottom layer;
a second spreader layer over said micro-LEDs, current from said second spreader layer spreading into said top layer, a bias applied across said first and second spreader layers causing said micro-LEDs to emit light.

2. The LED of claim 1, wherein said first spreader layer is a conductive substrate.

3. The LED of claim 1, further comprising a substrate adjacent to the surface of said first spreader layer opposite said micro-LEDs.

4. The LED of claim 3, wherein said substrate is insulating and said first spreader layer is an epitaxially deposited semiconductor material.

5. The LED of claim 1, further comprising an insulating layer covering said micro-LEDs and the surface of said first spreader layer between said micro-LEDs, said insulating layer disposed between said second spreader and said micro-LEDs.

6. The LED of claim 5, wherein said insulating layer has holes over each of said micro-LEDs and said second spreader making contact with each said micro-LED through said holes.

7. The LED of claim 6, wherein said second spreading layer is a sheet of transparent conducting material.

8. The LED of claim 6, wherein said second spreader layer is an interconnected current spreading grid having a plurality of interconnected conductive paths, each of said micro-LEDs having one or more conductive paths over it and making contact with said top layer through said holes.

9. The LED of claim 6, wherein said second spreader is an electrically conductive material.

10. The LED of claim 1, further comprising light extraction elements (LEEs) integrated with said micro-LEDs to interact with light escaping from said micro-LEDs to further enhance light extraction from said LED.

11. The LED of claim 10, wherein said LEEs are disposed between said micro-LEDs.

12. The LED of claim 10, wherein said LEES are disposed on the surface of said first spreader layer, between said micro-LEDs.

13. The LED of claim 10, wherein said LEEs are integrated on the side surfaces of said micro-LEDs.

14. The LED of claim 10, wherein said LEEs are integrated on the sides surfaces of said micro-LEDs and are disposed between said micro-LEDs.

15. The LED of claim 10, wherein said LEEs have curved surfaces.

16. The LED of claim 10, wherein said LEEs have linear or piecewise linear surfaces.

17. The LED of claim 10, wherein said LEEs are randomly roughened surfaces.

18. The LED of claim 1, further comprising respective electrical contacts disposed on said first and second spreader layers, a bias applied across said contacts causing said active layer to emit light.

19. The LED of claim 6, wherein said second spreader layer is a reflective metal layer that is deposited over said micro-LEDs, said LED further comprising substrate adjacent to the surface of said first spreader opposite said micro-LEDs and a submount layer affixed to said metal layer, said substrate of said LED becoming the primary light emission surface.

20. The LED of claim 19, further comprising a conductive finger between said submount and said first spreader layer, a first contact on said submount connected to said conductive finger, and a second contact on said submount connected to said metal layer, said micro-LEDs emitting light when a bias is applied across said contacts.

21. The LED of claim 1, wherein said bottom layers of said micro-LEDs are connected and said active and top layers are disconnected.

22. The LED of claim 1, wherein said second spreader layer is an interconnected current spreading grid with conductive paths between said micro-LEDs, said LED further comprising semiconductor material under said conductive paths between micro-LEDs, said semiconductor material electrically isolating said first spreader layer from said conductive paths.

23. The LED of claim 22, wherein said semiconductor material comprises an active layer sandwiched between two oppositely doped layers.

24. A light emitting diode (LED), comprising:
a first spreader layer;
an array of light emitting elements disposed on said first spreader layer;
a second spreader layer disposed over said array of emitting elements, said first spreader layer electrically isolated from said second spreader layer; and
first and second contacts on said first and second spreader layer respectively, a bias applied across said contacts causing said array of emitting elements to emit light.

25. The LED of claim 24, wherein said emitting elements are micro-LEDs, each having an active layer sandwiched between two oppositely doped layers.

26. The LED of claim 24, wherein oppositely doped layers are p and n-type layers, wherein either said p-type or n-type layer is a bottom layer adjacent to said first spreader layer and the other said layer is the top layer adjacent to said second spreader, current from said first spreader flowing into said bottom layer and current from said second spreader flowing into said top layer.

27. The LED of claim 24, further comprising a substrate adjacent to the surface of said first spreader layer opposite said emitting elements.

28. The LED of claim 24, wherein said second spreader layer is an interconnected current spreading grid covering said emitting elements and having a plurality of interconnected conductive paths between said emitting elements.

29. The LED of claim 24, wherein said second spreading layer is a sheet of transparent conducting material.

30. The LED of claim 28, further comprising an insulating layer covering said emitting element and the surface of said first spreader layer between said emitting elements, said second layer disposed on said insulating layer, said insulating layer electrically isolating said first spreader layer from said second spreader layer.

31. The LED of claim 30, wherein said insulating layer has holes over each of said emitting elements and said second spreader making contact with each said emitting element through said holes.

32. The LED of claim 31, each of said emitting elements having one or more conductive paths over it and making contact with said emitting elements through said holes.

33. The LED of claim 28, further comprising semiconductor material under said conductive paths between emitting elements said semiconductor material electrically isolating said first spreader layer from said conductive paths.

34. The LED of claim 33, wherein said semiconductor material comprises an active layer surrounded by two oppositely doped layers.

35. The LED of claim 24, further comprising light extraction elements between said emitting elements to redirect light emitting from said emitting elements.

36. The LED of claim 24, further comprising light extraction elements on the side surfaces of said emitting elements to redirect light emitting from said emitting elements.

37. A light emitting diode (LED), comprising:
a first spreader layer;
an array of micro-LEDs disposed on said first spreader layer, a current applied to said first spreader layer spreading to said micro-LEDs;
an interconnected current spreading grid disposed over said micro-LEDs, said grid having conductive paths between said micro-LEDs, a current applied to said grid spreading to said micro-LEDS.
semiconductor material under said conductive paths between micro-LEDs, said semiconductor material electrically isolating said first spreader layer from said conductive paths.
first and second contacts on said first and second spreader layer respectively, a bias applied across said contacts causing said array of emitting elements to emit light.

38. The LED of claim 37, wherein said semiconductor material comprises an active layer sandwiched between two oppositely doped layers.

* * * * *